(12) United States Patent
Xu et al.

(10) Patent No.: US 11,228,316 B2
(45) Date of Patent: Jan. 18, 2022

(54) METHOD, SYSTEM AND CIRCUIT FOR MULTI-DIE TIMING SIGNAL DISTRIBUTION

(71) Applicant: Arm Limited, Cambridge (GB)

(72) Inventors: Xiaoqing Xu, Austin, TX (US); Saurabh Pijuskumar Sinha, San Antonio, TX (US); Sheng-En Hung, Austin, TX (US); Chien-Ju Chao, Austin, TX (US)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 16/522,461

(22) Filed: Jul. 25, 2019

(65) Prior Publication Data

US 2021/0028788 A1    Jan. 28, 2021

(51) Int. Cl.
| | |
|---|---|
| *G05F 1/04* | (2006.01) |
| *H03K 3/00* | (2006.01) |
| *H03L 7/08* | (2006.01) |
| *G06F 1/06* | (2006.01) |
| *G06F 1/10* | (2006.01) |
| *G06F 1/12* | (2006.01) |

(52) U.S. Cl.
CPC .................. *H03L 7/08* (2013.01); *G06F 1/06* (2013.01); *G06F 1/10* (2013.01); *G06F 1/12* (2013.01)

(58) Field of Classification Search
CPC .... G06F 1/10; G06F 1/06; G06F 1/04; H03K 5/15013; G11C 7/22
USPC .................................................. 327/291–298
See application file for complete search history.

(56) References Cited

U.S. PATENT DOCUMENTS

| | | | | |
|---|---|---|---|---|
| 8,086,982 | B2 * | 12/2011 | Chang | ........................ G06F 1/10 716/108 |
| 8,525,569 | B2 * | 9/2013 | Bucelot | ..................... G06F 1/10 257/777 |
| 9,030,253 | B1 | 5/2015 | Ngai | |
| 10,318,684 | B2 * | 6/2019 | Dai | ........................ G06F 17/505 |

(Continued)

OTHER PUBLICATIONS

Park, et al, "Analysis, Design, and Prototyping of Temperature Resilient Clock Distribution Networks for 3-D ICs", IEEE Transactions on Components, Packaging and Manufacturing Technology, vol. 5, No. 11, Nov. 2015, pp. 1669-1678.

(Continued)

*Primary Examiner* — Quan Tra
(74) *Attorney, Agent, or Firm* — Berkeley Law & Technology Group, LLP

(57) ABSTRACT

Disclosed are methods, systems and devices for distribution of a timing signal among operational nodes of a circuit device comprising one or more circuit dies. In one implementation, a timing signal distribution network may transmit a timing signal to one or more operational circuit nodes formed on a circuit die and a clock circuit may generate a first clock signal for transmission as the timing signal to the one or more operational circuit nodes. A switch circuit may apply a second clock signal for transmission as the timing signal in lieu of the first clock signal if the circuit die is integrated at least one of the one or more other circuit dies. In another implementation, timing signals received at timing signal terminals of at least two of two or more of operational circuit nodes may be synchronized independently of the timing signal distribution network.

15 Claims, 12 Drawing Sheets

(56) References Cited

U.S. PATENT DOCUMENTS

| | | | | |
|---|---|---|---|---|
| 2001/0029599 | A1* | 10/2001 | Minami | G06F 17/505 |
| | | | | 716/113 |
| 2003/0093704 | A1* | 5/2003 | Chen | G06F 1/10 |
| | | | | 713/500 |
| 2013/0063206 | A1* | 3/2013 | Hirairi | G06F 1/10 |
| | | | | 327/564 |
| 2015/0168992 | A1* | 6/2015 | Choi | G06F 1/12 |
| | | | | 327/108 |
| 2018/0173271 | A1* | 6/2018 | Swamy | G06F 1/10 |
| 2019/0042505 | A1 | 2/2019 | Subbareddy et al. | |

OTHER PUBLICATIONS

Niioka, et. al., "Clock Skew Reduction for Stacked Chips Using Multiple Source Buffers", Hirosaki University, 2015 15th International Symposium on Communications and Information Technologies, pp. 327-330.

Cadence, "Innovus Implementation System", www.cadence.com, 2017, 4 pgs.

Notification of Transmittal of the International Search Report and the Written Opinion of the International Searching Authority, or the Declaration, App No. PCT/GB2020/050710, dated Aug. 10, 2020, 1 Page.

International Search Report, App No. PCT/GB2020/050710, dated Aug. 10, 2020, 6 Pages.

Written Opinion of the International Searching Authority, App No. PCT/GB2020/050710, dated Aug. 10, 2020, 12 Pages.

Invitation to Pay Additional Fees and, Where Applicable, Protest Fee, App No. PCT/GB2020/050710, dated Jun. 19, 2020, 13 Pages.

* cited by examiner

METHOD, SYSTEM AND CIRCUIT FOR MULTI-DIE TIMING SIGNAL DISTRIBUTION

BACKGROUND

1. Field

Disclosed are devices and techniques for distribution of a timing signal among operational circuit nodes of a circuit device.

2. Information

Circuit devices typically employ use of a common clock signal or timing signal to synchronize operation of different portions or subcircuits formed in a circuit device. Such a timing signal may comprise a periodic signal that is generated from a phase lock loop or other circuit capable of generating a periodic signal within acceptable jitter and/or frequency drift tolerances. In some implementations, different subcircuits of a circuit device that are to be synchronously operated may be separated from a single source of a timing signal by different distances along conductors such that the timing signal may travel over different distances to arrive at different subcircuits. These different distances for a timing signal to travel to different subcircuits may introduce "skew" in the timing signal as being received by the different subcircuits.

SUMMARY

Briefly, particular implementations are directed to a method comprising: generating a first clock signal from a first clock circuit formed on a first circuit die; applying the first clock signal as a timing signal for distribution to one or more operational circuit nodes formed on the first circuit die in one or more operations to test the one or more operational circuit nodes; and applying a second clock signal, the second clock signal being generated by a second clock circuit formed on a second circuit die, instead of the first clock signal as the timing signal for distribution to the one or more operational circuit nodes formed on the first circuit die if the first die is following integration of the first circuit die with the second die in a multi-die circuit.

Another particular implementation is directed to a method comprising: distributing timing signals to a plurality of operational circuit nodes formed on one or more circuit dice though a hierarchical timing signal distribution network; receiving the timing signals at timing signal terminals of two or more of the operational circuit nodes; and coupling timing signals received at timing signal terminals of at least two of the two or more of the operational circuit nodes independently of the hierarchical timing signal distribution network.

Another particular implementation is directed to a circuit die for integration with one or more other circuit dies in a multi-die circuit, the circuit die comprising: a timing signal distribution network to transmit a timing signal to one or more operational circuit nodes formed on the circuit die; a clock circuit to generate a first clock signal for transmission as the timing signal to the one or more operational circuit nodes; and a switch circuit to apply a second clock signal, the second clock signal generated externally to the circuit die, for transmission as the timing signal in lieu of the first clock signal if the circuit die is integrated with at least one of the one or more other circuit dies.

Another particular implementation is directed to a circuit device comprising: a plurality of operational circuit nodes formed on one or more circuit dice; a hierarchical timing signal distribution network to transmit timing signals to timing signal terminals of two or more of the plurality of operational circuit nodes; a clock circuit to generate a first clock signal for transmission as the timing signal to the one or more operational circuit nodes; and a circuit to couple timing signals received at timing signal terminals of at least two of the two or more of the operational circuit nodes independently of the hierarchical timing signal distribution network.

It should be understood that the aforementioned implementations are merely example implementations, and that claimed subject matter is not necessarily limited to any particular aspect of these example implementations.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may be best understood by reference to the following detailed description if read with the accompanying drawings in which:

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents.

DETAILED DESCRIPTION

References throughout this specification to one implementation, an implementation, one embodiment, an embodiment and/or the like means that a particular feature, structure, and/or characteristic described in connection with a particular implementation and/or embodiment is included in at least one implementation and/or embodiment of claimed subject matter. Thus, appearances of such phrases, for example, in various places throughout this specification are not necessarily intended to refer to the same implementation or to any one particular implementation described. Furthermore, it is to be understood that particular features, structures, and/or characteristics described are capable of being combined in various ways in one or more implementations and, therefore, are within intended claim scope, for example. In general, of course, these and other issues vary with context. Therefore, particular context of description and/or usage provides helpful guidance regarding inferences to be drawn.

Figure 1A:
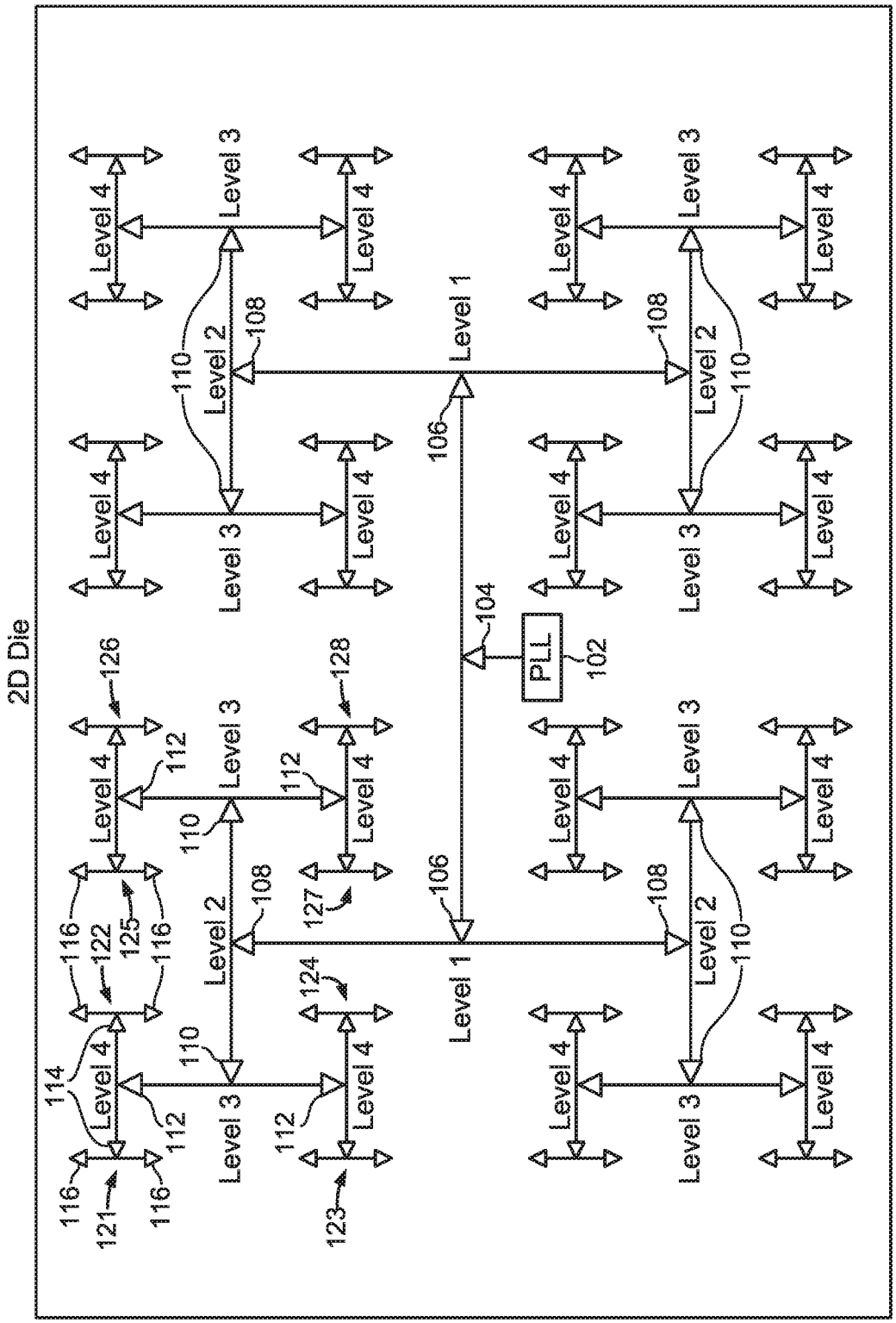
FIG. 1A is a schematic diagram of a hierarchical timing signal distribution network according to an embodiment.

According to an embodiment, a timing signal generated from a single source may be distributed among multiple operational circuit nodes formed in a circuit die to at least in part synchronize operations occurring at the different operational circuit nodes. In an example implementation, a hierarchical timing signal distribution network may distribute or transmit a timing signal among multiple operational circuit nodes formed in a circuit die as illustrated in FIG. 1A. In the particular illustrated embodiment, a hierarchical timing signal distribution network may comprise a particular topology such as an "H-tree" having equal length of interconnects between branches, or a flexible H-tree which is balanced electrically while actual physical lengths vary between branches. Additionally, for large system on a chip (SoC) devices, distribution of a timing signal across long distances over a device presents additional challenges to reduce timing signal skew. The particular example of a two-dimensional H-tree 2D clock tree shown in FIG. 1A includes a single clock signal source implemented as a phase-locked loop (PLL) circuit 102 to generate a timing signal for distribution from "LEVEL 1" to "LEVEL 4." It should be understood, however, that a PLL circuit is merely an example implementation of a clock signal source, and that claimed subject matter is not limited to a particular implementation of a timing signal source. For example, PLL circuit 102 may be replaced by one or more other timing generating elements to generate a timing signal for distribution such as, for example, a delay-locked loop (DLL), oscillator crystal and/or ring-oscillator without deviating from claimed subject matter. At a branch LEVEL 4, local clock sectors for a single LEVEL 4 branch are denoted with labels as 121 through 128. These labeled clock sectors may include additional branches, eventually connecting to leaf node circuits (e.g., including flip-flop circuits) defined by use of automated clock-tree synthesis algorithms or through custom design, for example. In an implementation, global/local H-trees may be "skew balanced" as physically symmetric H-trees or flex-H trees.

In the particular implementation of FIG. 1A, a timing signal (e.g., periodic pulse signal) generated by PLL circuit 102 received at buffer 104 may be applied to input terminals of buffers 106. Buffers 106 may then apply the received timing signal to branches at LEVEL 1. The timing signal applied to a single branch LEVEL 1 may be received at input terminals of buffers 108, and then applied to branches LEVEL 2 through buffers 108. The timing signal applied to branches LEVEL 2 may be received at input terminals of buffers 110, and then applied to branches LEVEL 3 through buffers 110. The timing signal applied to branches LEVEL 3 may be received at input terminals of buffers 112, and then applied to branches LEVEL 4 through buffers 112. The timing signal applied to branches LEVEL 4 may be received at input terminals of buffers 114, and then applied to leaf nodes 116 for affecting operation of associated operational circuit nodes.

Figure 1B:
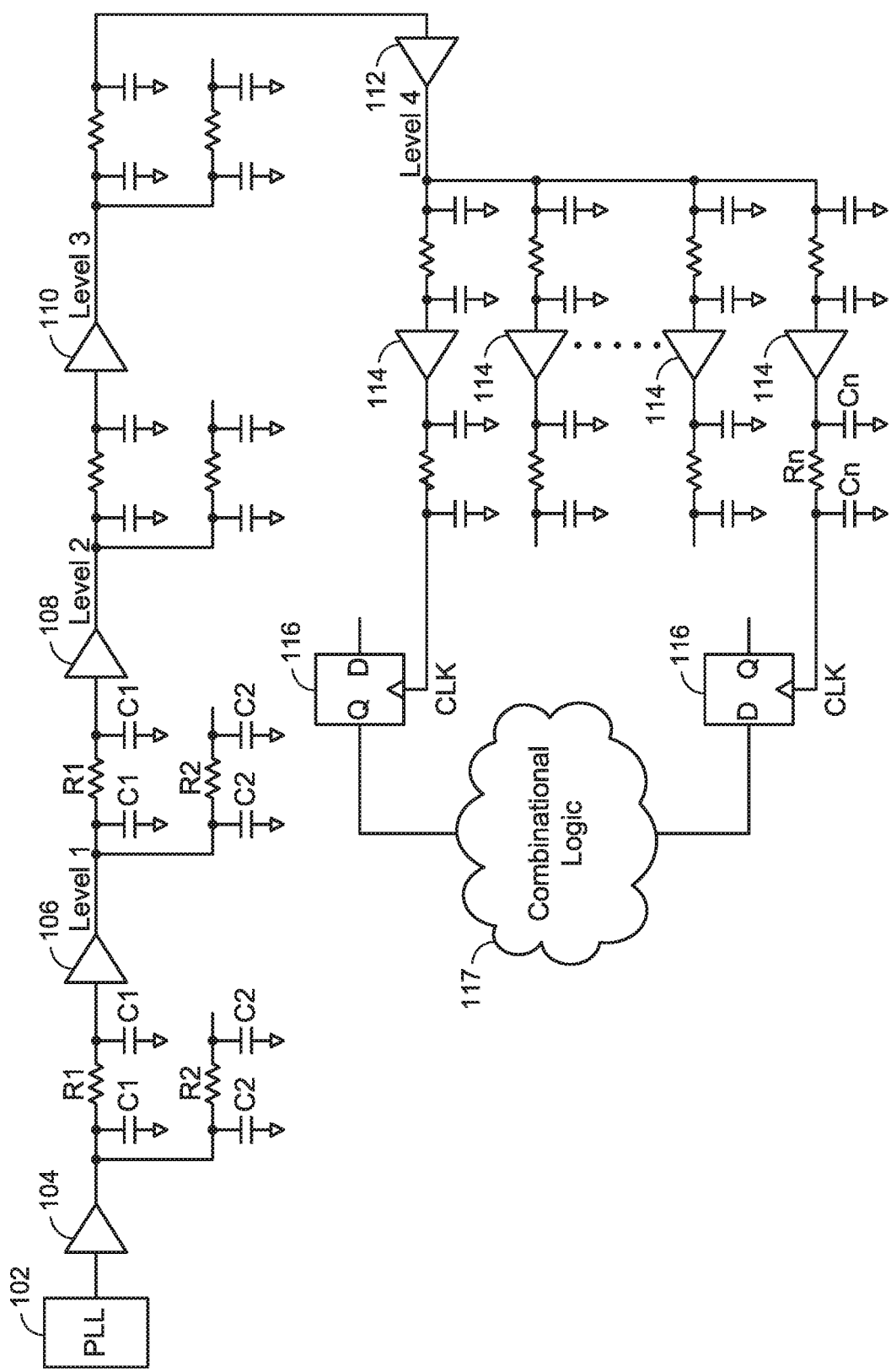
FIG. 1B is a schematic diagram of a circuit implementation of an aspect of a hierarchical timing signal distribution network according to an embodiment.

FIG. 1B is a schematic diagram of a circuit implementation of an aspect of a hierarchical timing signal distribution network, such as a hierarchical timing signal distribution network shown in FIG. 1A, according to an embodiment. As discussed above, a timing signal generated by PLL circuit 102 may be hierarchically distributed through branches LEVEL 1 through LEVEL 4 connected by buffers 108, 110 and 112. A timing signal received at LEVEL 4 may then be received at input terminals of buffers 114, and provided to input terminals of leaf nodes 116 comprising flip-flop circuits as shown in this particular implementation. Signals at output terminals of the flip-flop circuits may then be applied to operational circuit nodes (not shown) in combinational logic 117 to control operation of the operational circuit nodes to, for example, synchronize operation of the operational circuit nodes with other operational circuit nodes elsewhere on a circuit device. According to an embodiment, LEVEL 1 through LEVEL 4 branches may be formed, at least in part, as metal conductors formed using well known processes for forming conductors in an integrated circuit device.

Figure 2A:
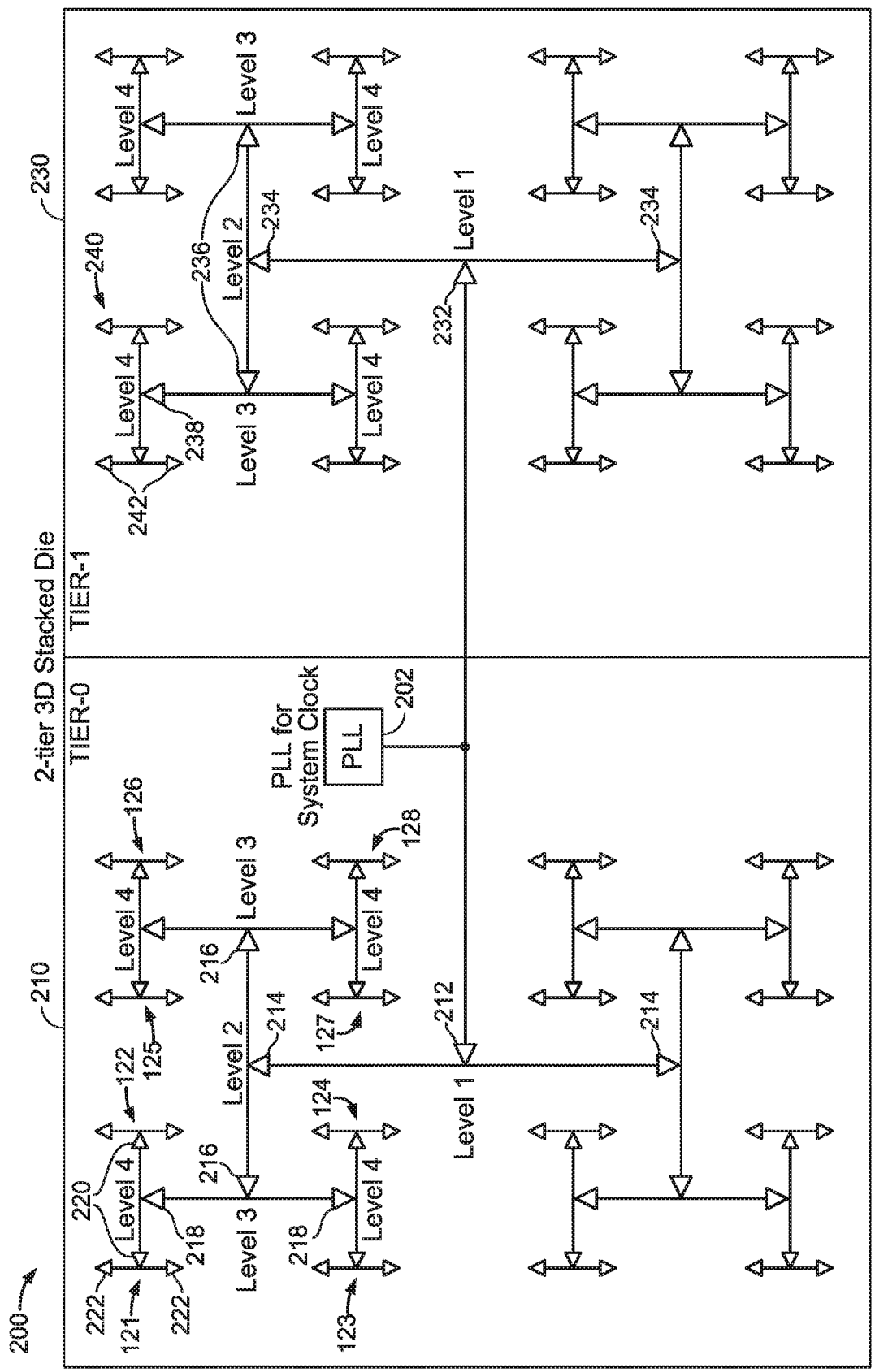
FIG. 2A is a schematic diagram of a timing signal distribution network to distribute a timing signal among operational circuit nodes formed in multiple circuit dice of a multi-die circuit device according to an embodiment.

In a particular embodiment, a multi-die device may be designed to be in any one of several different configurations such as, for example, a multi-chip configuration (MCM, 2.5D) or a stacked 3D (3D-IC) configuration in which operation of operational circuit nodes may be synchronized across different circuit dice or the same circuit die. In an embodiment, a multi-die device may comprise circuit dice that are separately manufactured (e.g., using processes suitable for forming complementary metal oxide semiconductor devices) which are then integrated into a single device package as part of a system on a chip (SoC) and/or for integration with a larger system (e.g., a single device package comprising a ball grid array to be coupled to a printed circuit board). In an example implementation, a timing signal distribution network may be formed as a hierarchical "tree" having separate branches to distribute a timing signal to operational circuit nodes formed on different associated dice of a multi-die circuit device. Here, as illustrated in the particular implementation of FIG. 2A, a timing signal distribution network may be split into separate LEVEL 1 branches, each LEVEL 1 branch distributing a timing signal for operational circuit nodes of a particular associated die or "tier" in a multi-chip device.

Figure 2B:
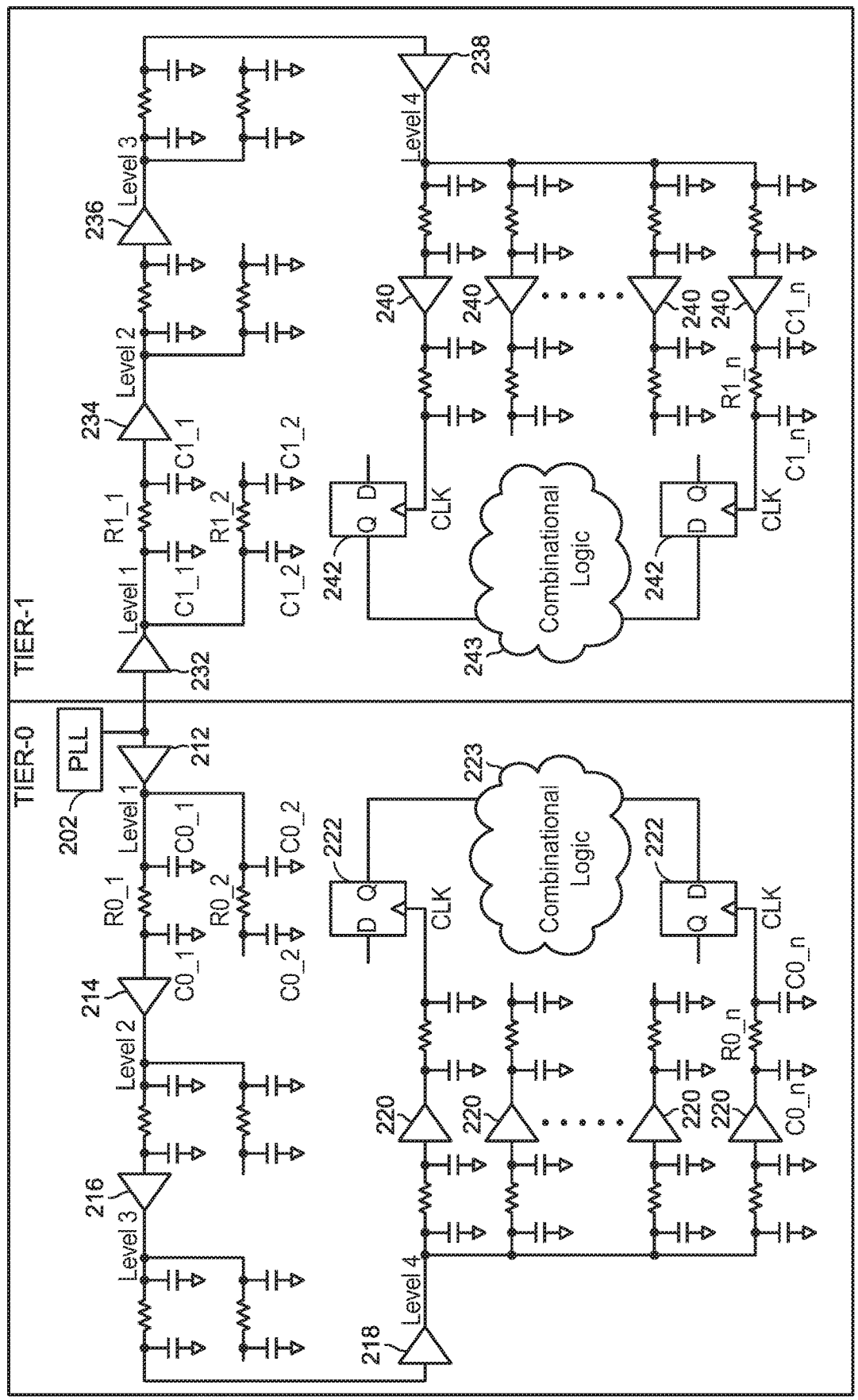
FIG. 2B is a schematic diagram of a circuit implementation of an aspect of a hierarchical timing signal distribution network according to an embodiment.

In one embodiment, to improve yield, individual dies forming a multi-die device may be individually tested before integration in the multi-die device. For example, subcircuits formed in dice 210 and 230 may be separately tested before integration of dice 210 and 230 in a single device. While a PLL circuit 202 is formed in die 210 to provide a timing signal source, no such PLL circuit is formed in die 230. Thus to operationally test subcircuits of die 230 prior to integration with die 210 in a multi-die device, a timing signal may be externally applied to a branch of a clock distribution network formed on die 230 for distribution to leaf nodes 242. In an implementation, a timing signal generated at PLL circuit 202 may be transmitted to buffer 232 on circuit die 230 through a die-to-die communication interface and/or low latency die-to-die signaling bus (not shown). This is illustrated in FIG. 2B in that a timing signal received at an input terminal of buffer 232 may be hierarchically distributed to leaf nodes 242 comprising flip-flop circuits to control operation of operational circuit nodes of combinational logic 243. Here, during testing of operation of subcircuits of die 230, a timing signal may be applied from an external source (not shown), which may have a slower periodicity than a timing signal applied during operation of device 200. Thus, full testing of operation of subcircuits of die 230 at full operational speed may not occur until die 230 is fully integrated with die 210 in a multi-chip device.

Figure 3A:
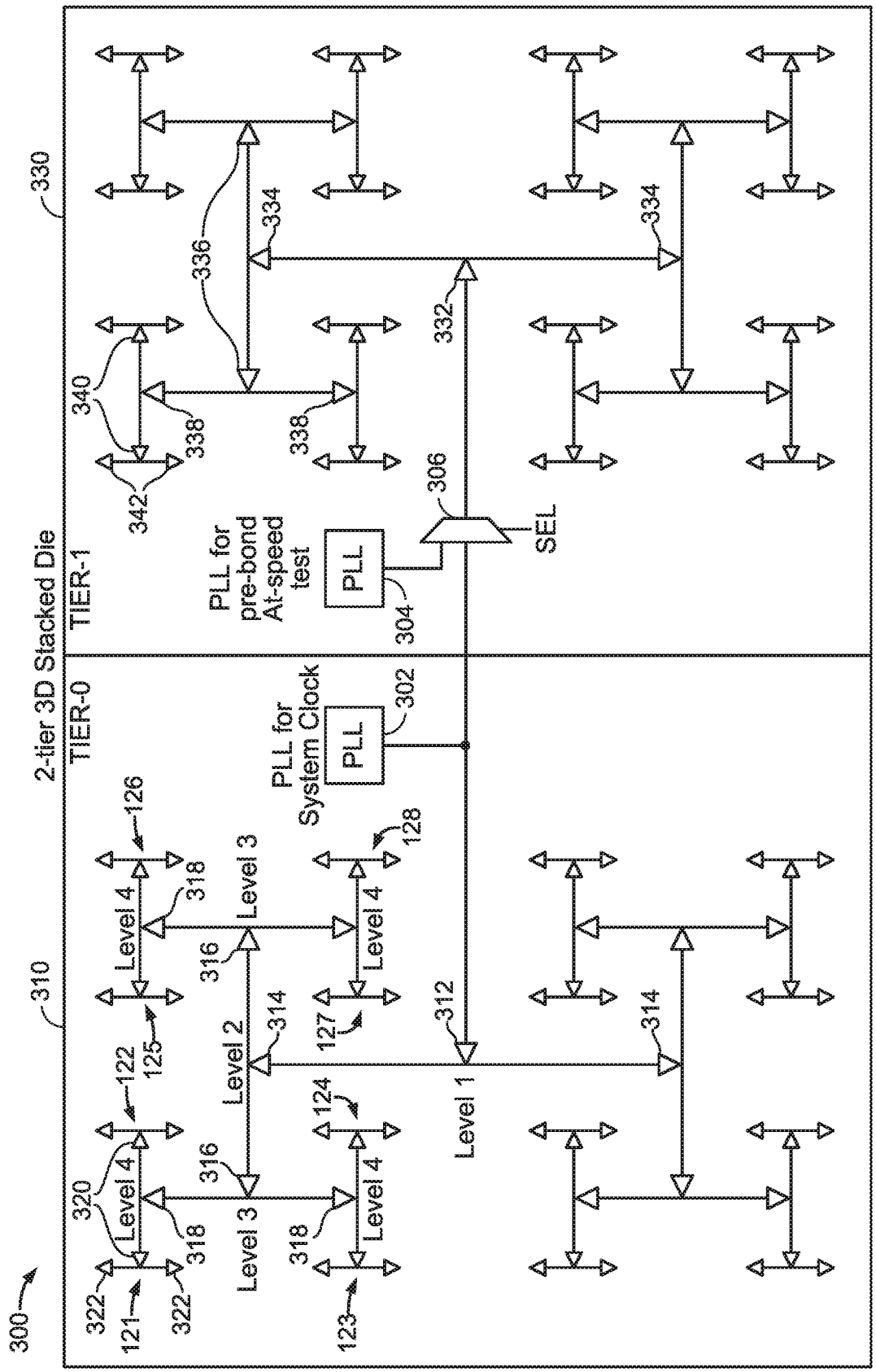
FIG. 3A is a schematic diagram of a timing signal distribution network employing a local timing circuit formed on a single circuit die for testing prior to integration in a multi-die circuit device according to an embodiment.

In the particular implementation of FIG. 3A, PLL circuits to generate a timing signal are separately formed on each of dies 310 and 330 (to be integrated in a single multi-die circuit device). Here, PLL circuit 304 formed on die 330 may generate a timing signal to be distributed to leaf nodes 342 in a test operation performed before integration of die 330 with die 310 in a multi-die device. This may allow testing of subcircuits of die 330 at full operational speed prior to integration of die 330 with die 310 in a single multi-die device, thus allowing more robust testing of die 330 at full operational speed before integration of die 330 with die 310 in a multi-die circuit device. Here, testing subcircuits of die 330 at a full operational speed prior to integration with die 310 in a multi-die device may enable detecting defects in a die 330 earlier in a manufacturing process than possible if subcircuits of die 330 are tested at a slower operational speed (and not at full speed until die 330 is integrated in a multi-die circuit device), which may allow for a higher overall manufacturing yield for the multi-die device.

Figure 3B:
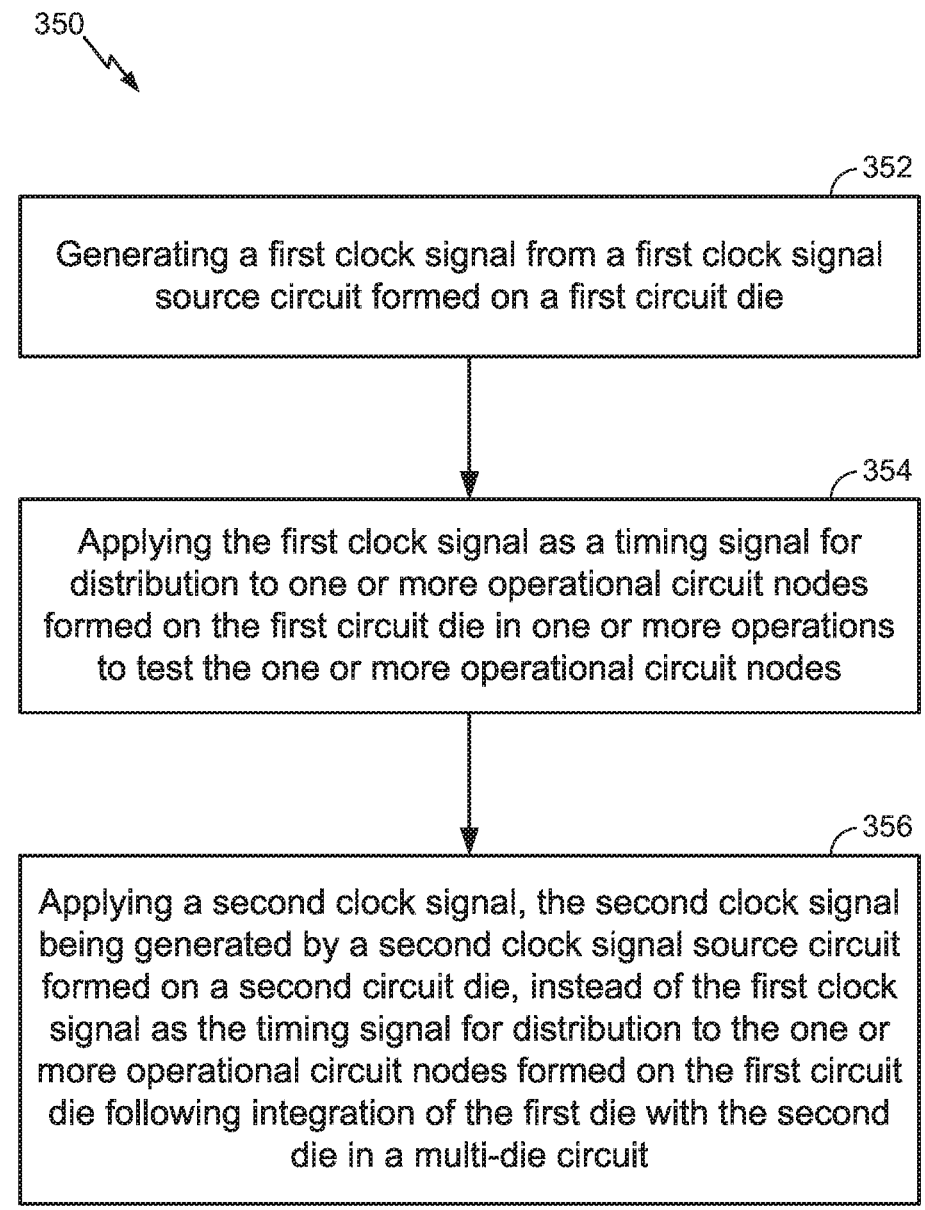
FIG. 3B is a flow diagram of a process of employing a local timing circuit formed on a single circuit die for testing prior to integration in a multi-die circuit device according to an embodiment.

FIG. 3B is a flow diagram of a process 350 that may be employed in some aspect to test a circuit die (such as circuit die 330) prior to integration of the circuit die with one or more other circuit dice in a multi-die circuit device. Here, block 352 may comprise generating a first clock signal from a first clock signal source circuit formed in a first die. Such a first clock signal source circuit may comprise a timing circuit such as PLL circuit 304, or any other clock signal circuit formed in a die which is capable of generating a periodic timing signal. Block 354 may then apply the first clock signal generated at block 352 as a timing signal for distribution to one or more operational circuit nodes formed on the first circuit die in one or more operations to test the one or more operational circuit nodes formed in the first circuit die. For example, block 354 may comprise setting a selection signal SEL applied to a terminal of multiplexer 306 to connect a clock signal generated by PLL circuit 304 to buffer 332 for distribution to leaf nodes 342 (e.g., implemented at least in part by flip-flop circuits). Following integration of the first circuit die with a second circuit die, a second clock signal generated by a second clock signal source formed on the second circuit die may be applied as the timing signal for distribution to the one or more operational circuit nodes formed in the first circuit die. Block 356 may comprise setting selection signal SEL such that multiplexer circuit 306 disconnects PLL circuit 304 from buffer 332 and connects a timing signal generated by PLL circuit 302 to buffer 332 for distribution to leaf nodes 342. In an embodiment, selection signal SEL may be asserted or deasserted from an inter-die signaling bus. For example, selection signal SEL may be asserted on a power up event, for example.

In this context, an "operational circuit node" as referred to herein comprises an identifiable portion of circuit formed on a die which is executable under the control of a timing signal. In an example implementation, an operational circuit node may be dedicated to performing a specific function such as, for example, input/output, repetitive computations data or signal formatting, just to provide a few examples.

As pointed out above, skew in a timing signal distributed to operational circuit devices of a multi-die circuit device may occur as the timing signal travels from a clock signal source over different distances to different leaf nodes of a hierarchical timing signal distribution network. For example, a timing signal generated by PLL circuit 302 may travel different distances to arrive at a leaf node 322 on circuit die 310 and a leaf node 342 on circuit die 330. These different distances for a timing signal generated by PLL circuit 302 to arrive at a leaf node 322 on circuit die 310 and a leaf node 342 on circuit die 330 may give rise to skew.

Figure 4A:
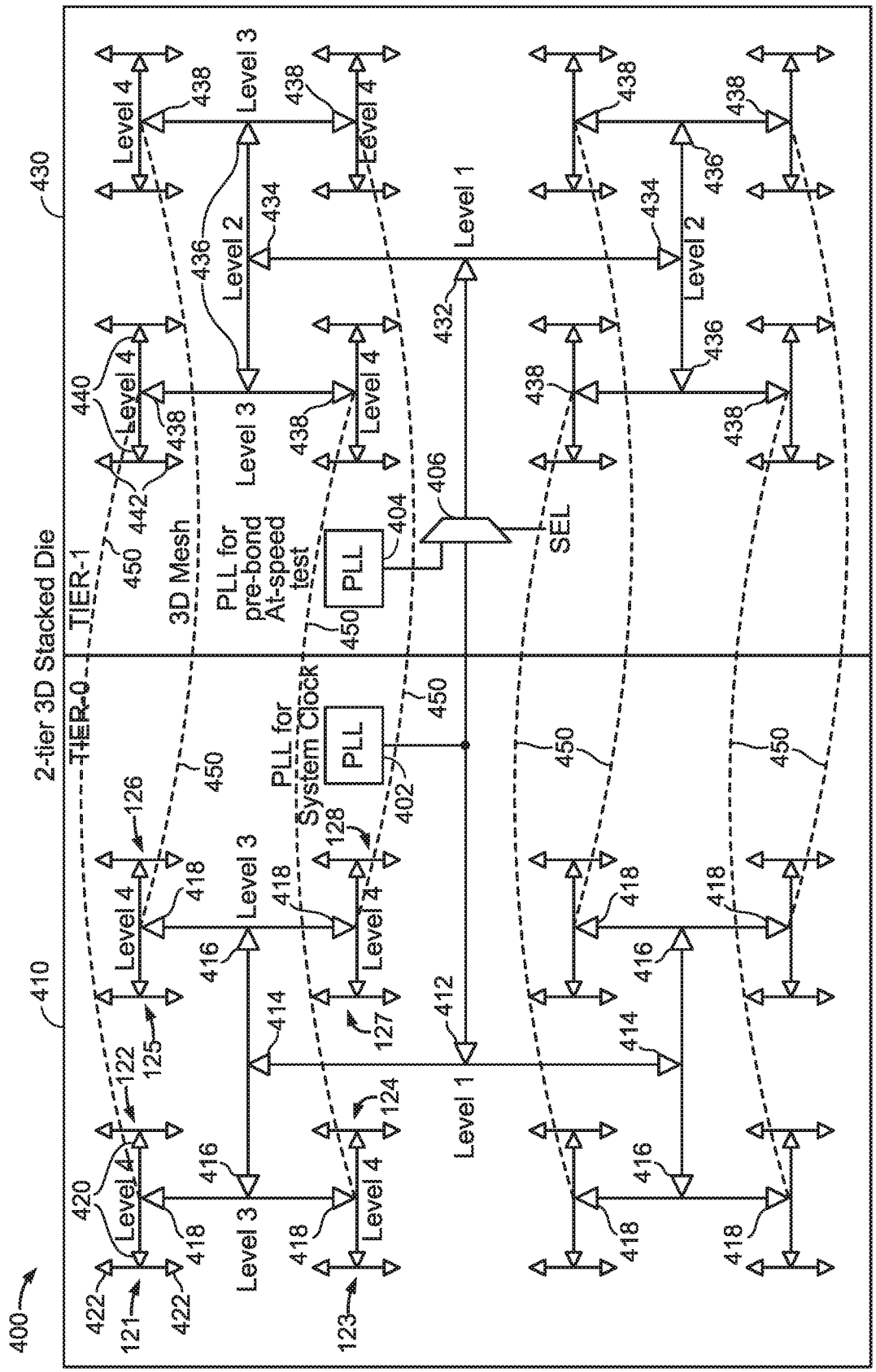
FIGS. 4A and 4C are schematic diagrams of aspects of a multi-die circuit device in which timing signals received at operational circuit nodes from a hierarchical timing signal distribution network may be synchronized independently of the hierarchical timing signal distribution network according to particular embodiments.
Figure 4B:
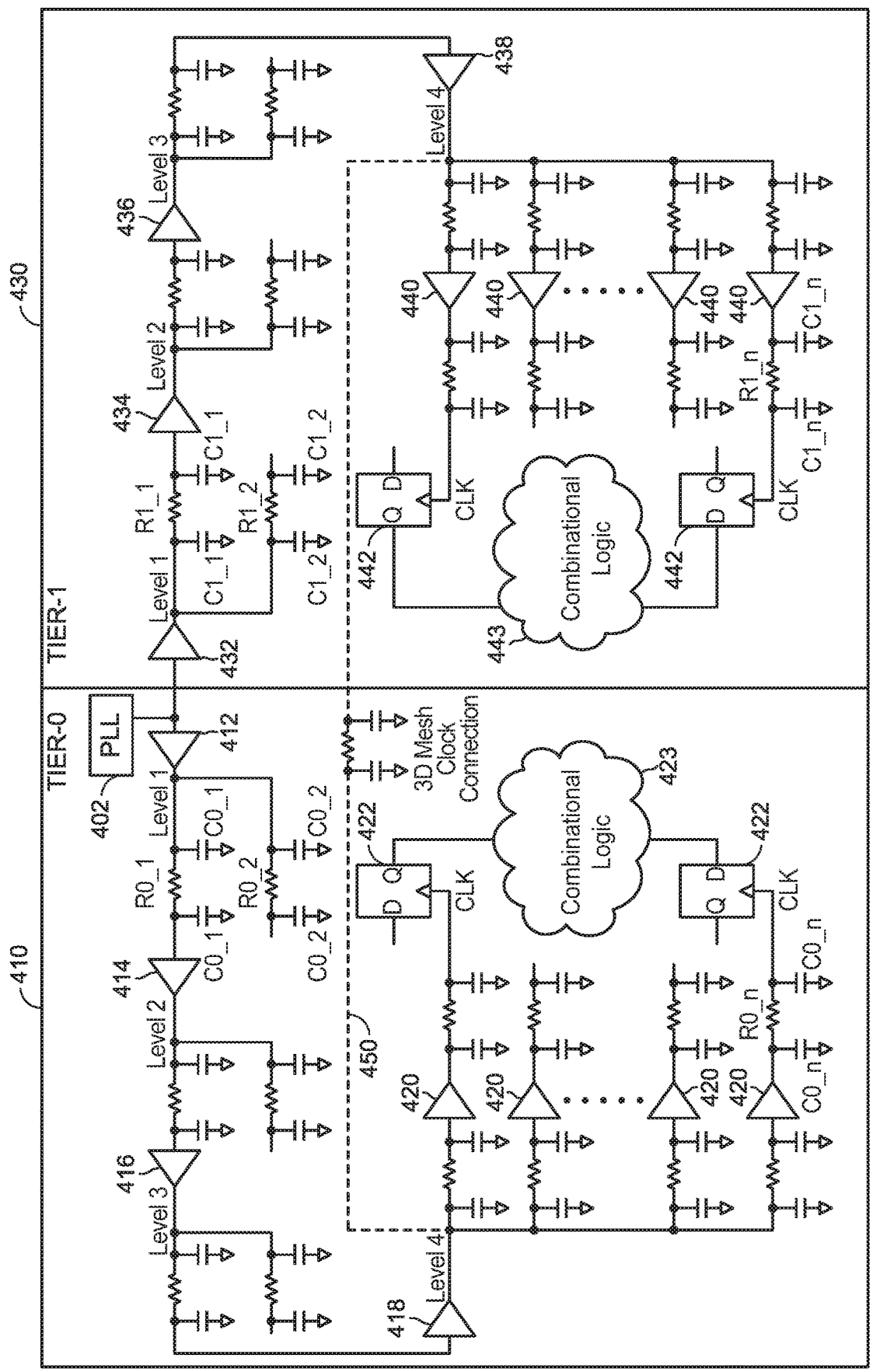
FIG. 4B is a schematic diagram of a circuit implementation of aspects of a multi-die circuit device in which timing signals received at operational circuit nodes from a hierarchical timing signal distribution network may be synchronized independently of the hierarchical timing signal distribution network according to particular embodiments.
Figure 4C:
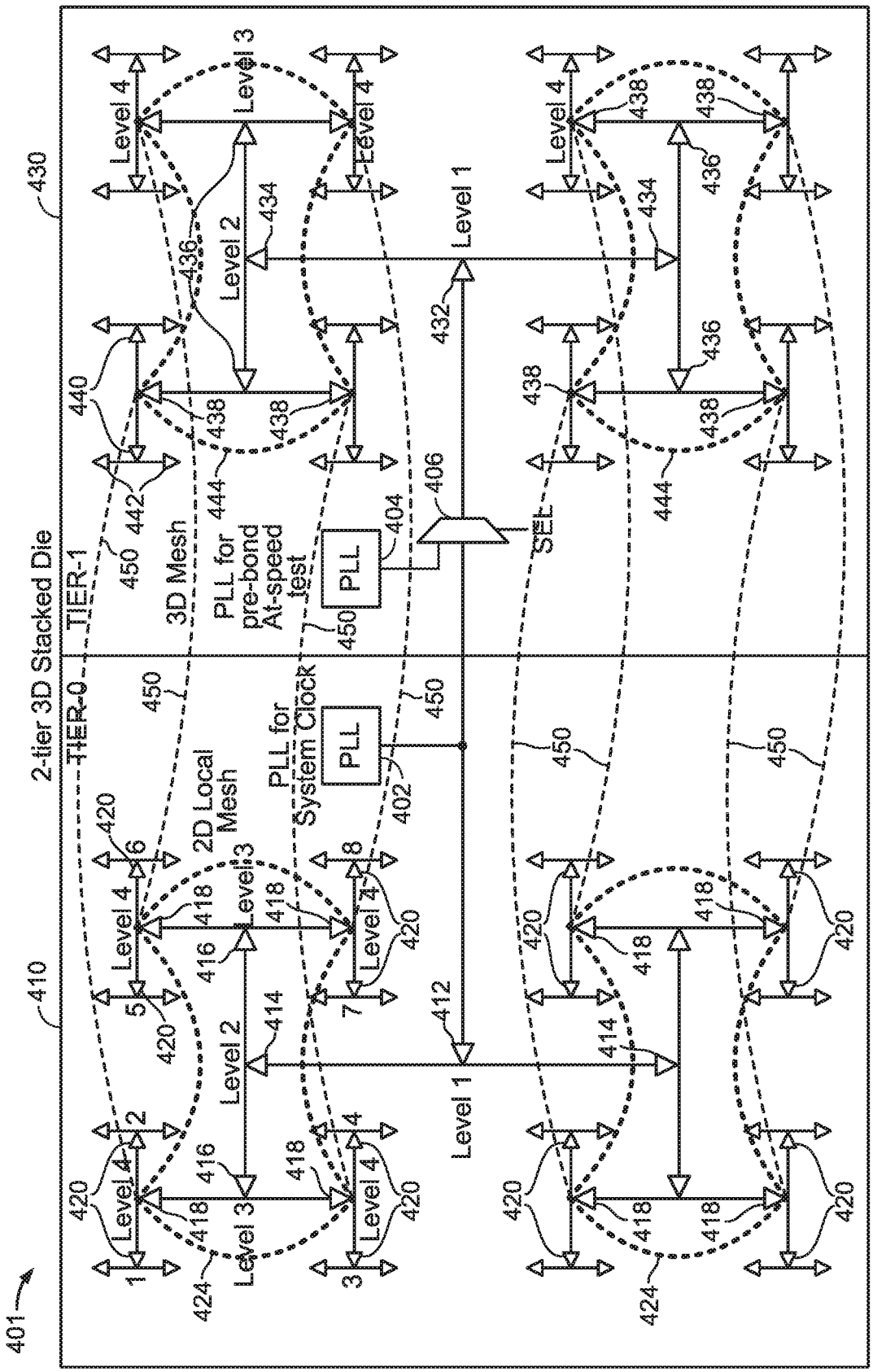

FIGS. 4A, 4B and 4C are schematic diagrams of aspects of a multi-die circuit device in which timing signals received at operational circuit nodes from a hierarchical timing signal distribution network may be coupled independently of the hierarchical timing signal distribution network according to particular embodiments. This may enable a reduction or elimination in skew between a distributed timing signals arriving at different leaf nodes on the same die or different dice of a multi-die circuit integrated device.

In the particular implementation of FIG. 4A, one or more conductors 450 may be implemented to connect LEVEL 4 branches formed on different dies 410 and 430 of a multi-die circuit device. According to an embodiment, conductors 450 may be implemented, at least in part, by a low-latency inter-die signaling bus suitable for transmitting control or data signals between circuit dies of a multi-die circuit device. Here, by connecting LEVEL 4 branches of coupled to leaf nodes formed on different dies, skew of a timing signal distributed to the leaf nodes formed on the different dies may be reduced or eliminated. For simplicity, the particular implementation of FIG. 4A shows connections of LEVEL 4 branches between two different dies of a multi-die circuit device. It should be understood that LEVEL 4 branches of three or more dice of a multi-die circuit device may be similarly connected to reduce or eliminate skew among distributed timing signals arriving at the LEVEL 4 branches of the three or more dice. Additionally, the particular implementation of FIG. 4A shows that each LEVEL 4 branch of circuit die 410 is connected to a LEVEL 4 branch of circuit die 430, and vice versa. It should be understood that in other embodiments less than all of LEVEL 4 branches on one circuit die are necessarily connected to a LEVEL 4 branch on another circuit die. While the presently illustrated embodiment applies conductors between LEVEL 4 branches of dies 410 and 430 to deskew timing signals received at the LEVEL 4 branches, in alternative embodiments conductors may be applied between LEVEL 3 branches (to deskew timing signals between dies 410 and 430 at LEVEL 3 branches) or applied between LEVEL 2 branches (to deskew timing signals between dies 410 and 430 at LEVEL 2 branches).

FIG. 4B illustrates an example circuit implementation of a multi-die device in which a LEVEL 4 branch of a first die of a multi-die device is connected to a LEVEL 4 branch of a second die of the multi-die device to reduce or eliminate clock skew between timing signals received at leaf nodes formed on the first circuit die and leaf nodes formed on the second circuit die. As shown, a conductor 450 is coupled between input terminals of buffer circuits 420 on circuit die 410 (LEVEL 4 branch of circuit die 410) and input terminals of buffer circuits 440 on circuit die 430 (LEVEL 4 branch of circuit die 430). Thus, this may further synchronize and reduce or eliminate skew between timing signals received at flip-flop circuits of leaf nodes 422 on circuit die 410 and a timing signal received at flip-flop circuits of leaf nodes 442 on circuit die 430.

Figure 6:
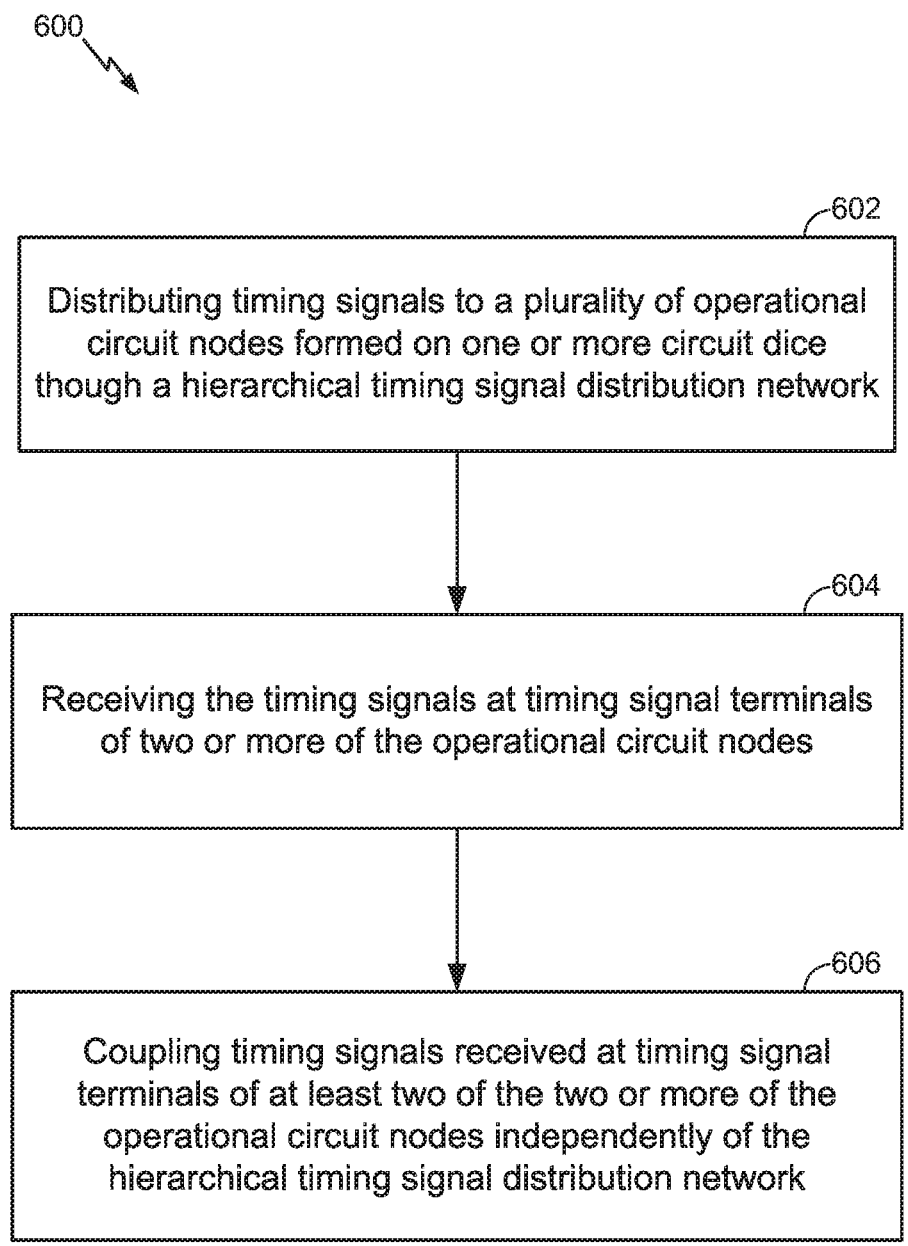
FIG. 6 is a flow diagram of a process to synchronize a timing signal received at different operational circuit nodes of a circuit device according to an embodiment.

As may be observed, the particular implementation of FIGS. 4A and 4B may enable implementation of a process 600 illustrated in FIG. 6 for coupling timing signals received at timing signal terminals at operational circuit nodes independently of a hierarchical timing signal distribution network. Here, timing signals may be distributed to a plurality of operational circuit nodes formed on one or more circuit dice through a hierarchical timing signal distribution network. In this context, a hierarchical timing signal distribution network comprises circuitry to distribute a timing signal generated by a timing signal source circuit to multiple operational circuit nodes through multiple nodes or distribution points descending from the timing signal source circuit according to a hierarchy such as a tree hierarchy. Such a hierarchical timing signal distribution network is illustrated in FIGS. 4A and 4B by non-limiting example in that LEVEL 1, LEVEL 2, LEVEL 3 and LEVEL 4 branches of circuit dies 410 and 430 may provide multiple nodes or distribution points descending from PLL circuit 402 to distribute a timing signal to leaf nodes 422 and 442. Additionally, example embodiments shown in FIGS. 4A and 4B include four hierarchical levels of branches LEVEL 1 through LEVEL 4 to illustrate aspects of the present disclosure. It should be understood, however, that other embodiments may comprise three or fewer hierarchical levels of branches, or five or greater hierarchical levels of branches without deviating from claimed subject matter. Particular example implementations described herein may comprise a hierarchical timing signal distribution network implemented as a "H-tree," flex H-tree, or some variation thereof. It should be understood, however, that particular examples of a hierarchical timing signal distribution network as described herein, such as in FIGS. 4A and 4B, are merely examples of a hierarchical timing signal distribution network, and that claimed subject matter is not limited in this respect.

In an embodiment, block 602 may comprise distributing timing signals to a plurality operational circuit nodes, such as operational circuit nodes implemented in combinational logic 423 or 443, through a hierarchical timing signal distribution network such as a hierarchical timing signal distribution network implemented by LEVEL 1, LEVEL 2, LEVEL 3 and LEVEL 4 branches. Block 604 may comprise receiving timing signals distributed at block 602 to timing signals terminals of two or more of the operational circuit nodes. For example, input terminals of flip-flop circuits of leaf nodes 422 and 442 may implement timing signal terminals of operational circuit nodes which are implemented by combinational logic 423 and 443. Block 606 may comprise coupling timing signals received at timing signals terminals of two or more operational circuit nodes independently of the hierarchical timing signal distribution network. For example, block 606 may comprise coupling timing signals received at flip-flop circuits of leaf nodes 422 and 442 by connecting LEVEL 4 branches through a conductor 450 as illustrated in FIGS. 4A and 4B. In this manner, coupling LEVEL 4 branches formed on different circuit dies 410 and 430 enables deskew of timing signals received at different flip-flop circuits independently of the hierarchical timing signal distribution network formed by LEVEL 1, LEVEL 2, LEVEL 3 and LEVEL 4 branches formed on circuit dies 410 and 430.

In an alternative implementation, block 606 may comprise coupling timing signals received at timing signals terminals of two or more operational circuit nodes formed on the same circuit die. As shown in the particular implementation of FIG. 4C, LEVEL 4 branches descending from the same LEVEL 2 branch are coupled together by a conductor 424 at output terminals of buffers 418 descending from the same LEVEL 2 branch and/or input terminals of buffers 420 descending from the same LEVEL 2 branch. It should be understood that block 606 may comprise application of a conductor 424 connecting output terminals of buffers 418 descending from the same LEVEL 2 branch and/or input terminals of buffers 420 with or without application of a conductor 450 coupling LEVEL 4 branches formed on different circuit dies 410 and 430. The particular implementation of FIG. 4C shows that conductors 424 couple LEVEL 4 branches descending from the sample LEVEL 2 branch to deskew a timing signal arriving at these LEVEL 4 branches. In other embodiments, conductors may be applied to couple LEVEL 3 branches (e.g., to deskew a timing signal arriving at LEVEL 3 branches) or LEVEL 2 branches (e.g., to deskew a timing signal arriving at LEVEL 2 branches).

Figure 4D:
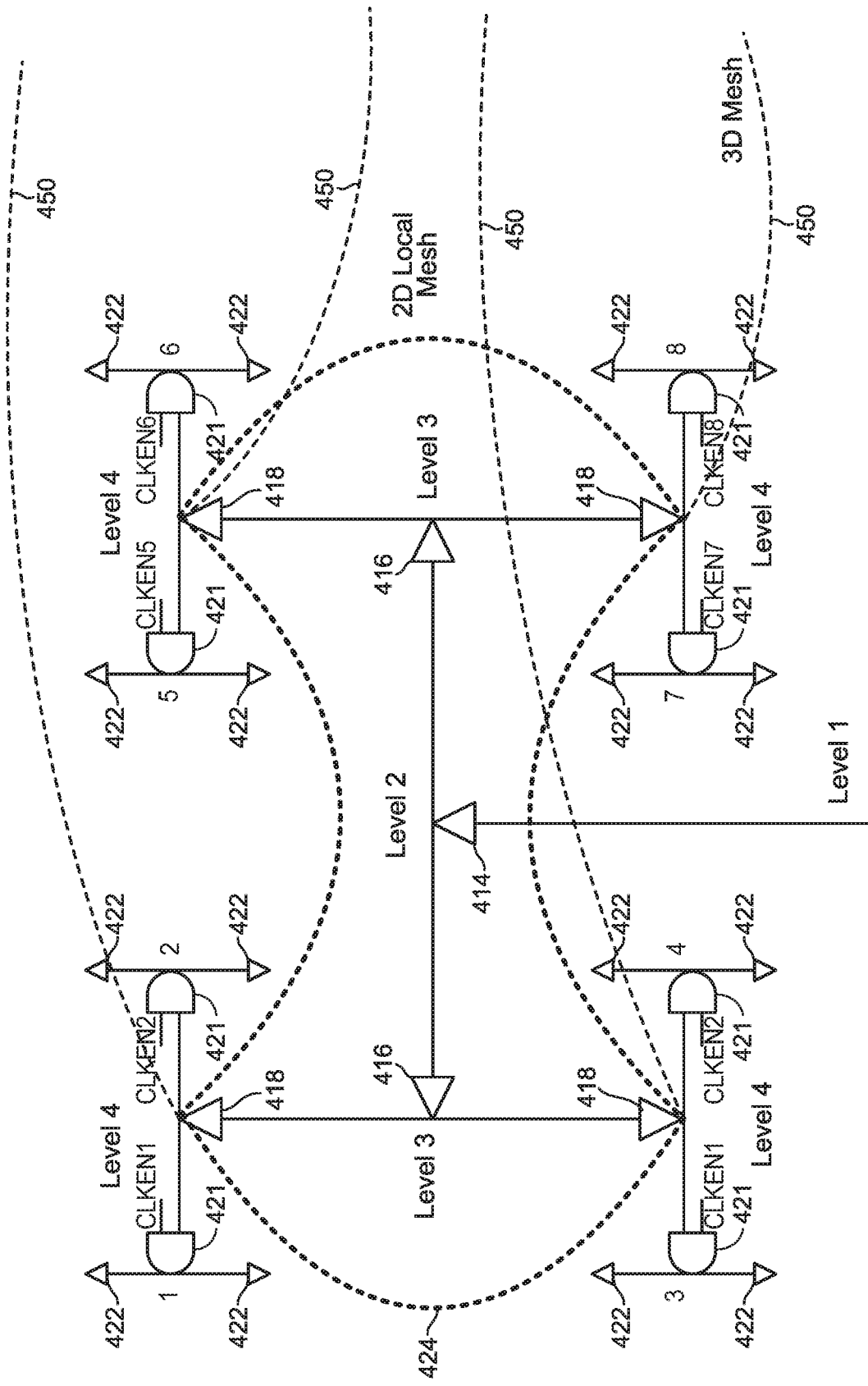
FIG. 4D is a schematic diagram of clock distribution network in which a timing signal may selectively enabled or disabled to be received at particular operational circuit nodes of a circuit device according to an embodiment.

In some applications, it may be advantageous to disable or power down individual operational circuit nodes formed on a circuit die. For example, there may be a desire to enable lower power operating modes for portable devices which are powered by a limited battery source. FIG. 4D is a schematic diagram of clock distribution network in which an operational circuit node may be selectively enabled or disabled to receive a timing signal from a LEVEL 4 branch. According to an embodiment, a timing signal may be distributed to timing signal terminals of operational circuit nodes at output terminals of AND circuits 421. Here, an AND circuit 421 may receive a distributed timing signal from a LEVEL 4 branch at a first input terminal of the AND circuit 421 and receive a clock enable signal "CLKENX" signal at a second input terminal of the AND circuit 421. To enable an operational circuit node to receive the distributed timing signal, a corresponding clock enable signal may be maintained high. To disable the operational circuit node from receiving the distributed timing signal, the corresponding clock enable signal may be maintained low. In the particular illustrated embodiment, AND circuits 421 are coupled to receive a LEVEL 4 branch signal at an input terminal to selectively enable or disable terminal leaves. In other implementations, an AND circuit may be coupled to receive a LEVEL 3 signal at an input terminal (to selectively enable or disable an entirety of operational circuit nodes of leaves descending from a LEVEL 4 branch) or a LEVEL 2 branch (to selectively enable or disable an entirety of operational circuit nodes of leaves descending from a LEVEL 3 branch).

Figure 5:
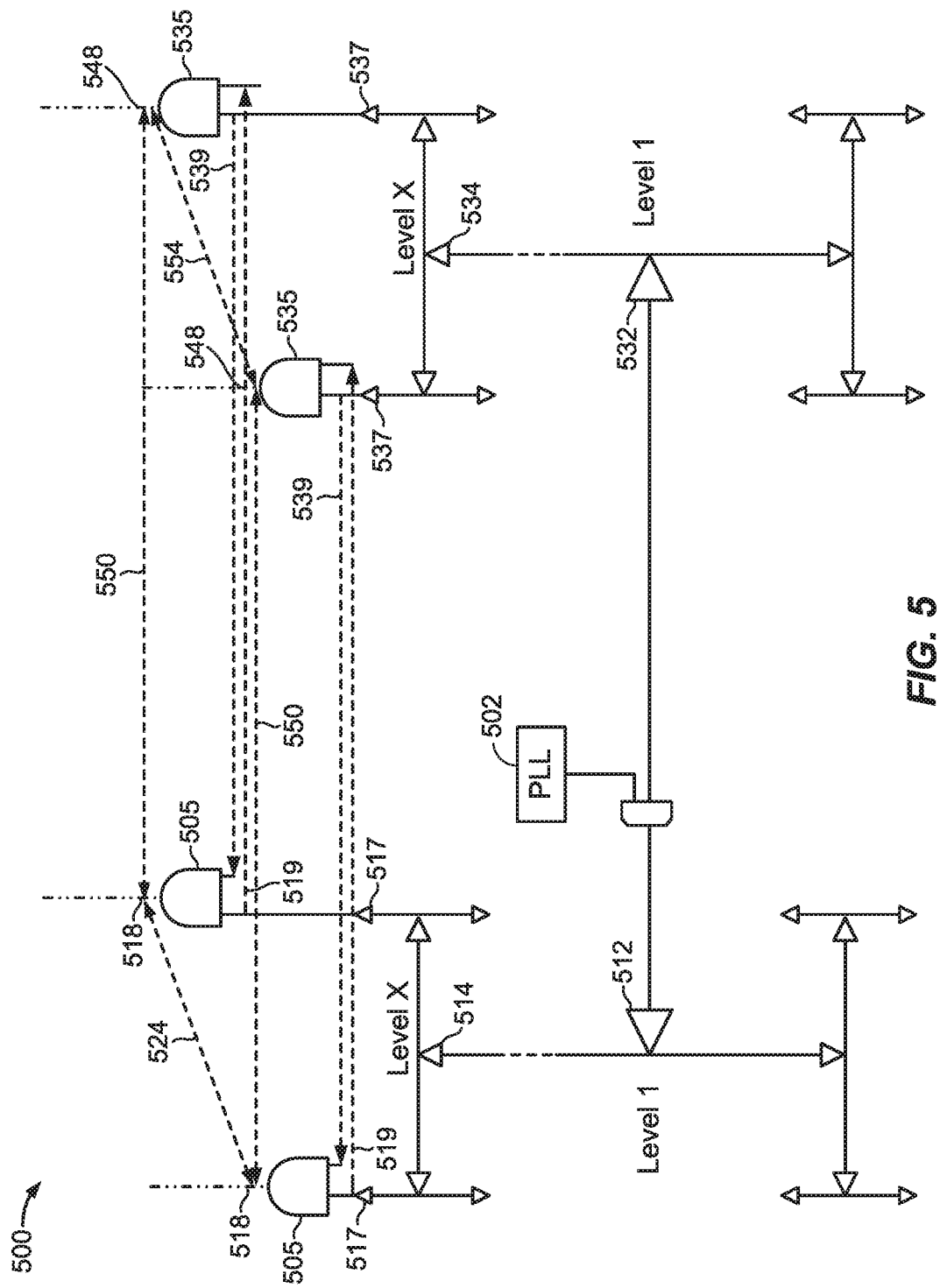
FIG. 5 is a schematic diagram of clock distribution network in which a timing signal distributed to different dies in a multi-die circuit device may be recombined at an AND circuit according to an embedment.

FIG. 5 is a schematic diagram of clock distribution network in which a timing signal distributed to operational circuit nodes on different dies of a multi-die circuit device may be recombined at an AND circuit according to an embodiment. A timing signal may be generated by PLL circuit 502 and distributed to operational nodes formed on two different circuit dies of a multi-die circuit device as described above. On a first circuit die, a buffer 512 may receive the generated timing signal at an input terminal and apply the received timing signal to a LEVEL 1 branch of a hierarchical timing signal distribution formed on the first circuit die. AND circuits 505 formed on the first circuit die may receive the distributed timing signal through a buffer 517 at a first input terminal. Likewise on a second circuit die, a buffer 532 may receive the generated timing signal at an input terminal and apply the received timing signal to a LEVEL 1 branch of a hierarchical timing signal distribution formed on the second circuit die. AND circuits 535 formed on the second circuit die may receive the distributed timing signal through a buffer 537 at a first input terminal.

In a particular implementation, a timing signal received from a hierarchical timing signal distribution network on the first circuit die at an AND circuit 505 formed on the first circuit die may be provided to a second input terminal of an AND circuit 535 formed on the second circuit die. Likewise, a timing signal received from a hierarchical timing signal distribution network on the second circuit die at an AND circuit 535 formed on the first circuit die may be provided to a second input terminal of an AND circuit 535 formed on the first circuit die. As shown in the currently illustrated embodiment, an output terminal of a buffer 517 is coupled to a first input terminal of an AND circuit 505 (formed on the first circuit die) and is coupled through a conductor 519 of an inter-die communication interface to a second input terminal of an AND circuit 535 (formed on the second circuit die). Likewise, an output terminal of a buffer 537 is coupled to a first input terminal of an AND circuit 535 (formed on the second circuit die) and is coupled through a conductor 539 of an inter-die communication interface to a second input terminal of an AND circuit 505 (formed on the first circuit die). According to an embodiment, output terminals of AND circuits 505 and 535 may provide deskewed timing signals.

In an optional implementation, output terminals 518 of AND circuits 505 on the same die may be coupled by a conductor 524 to further deskew timing signals provided at output terminals 518. Likewise in another optional implementation, an output terminal 518 of an AND circuit 505 formed on the first circuit die and an output terminal 548 may be coupled by a conductor 550 to further deskew timing signals provided at the output terminal 518 and output terminal 548.

In particular implementations, output terminals 518 of AND circuits 505 and output terminals 548 of AND circuits 535 may be applied directly to terminal nodes of hierarchical timing signal distribution networks (e.g., directly to input terminals of flip-flop circuits to control operation of operational circuit nodes). Alternatively, output terminals 518 of AND circuits 505 and output terminals 548 of AND circuits 535 may be coupled to input terminals of buffer circuits to distribute a timing signal to lower branches in a hierarchical timing signal distribution network between the AND circuits 505 and 535 and terminal nodes. Thus, in the particular scheme in FIG. 5 AND circuits 505 and 535 may be inserted at any branch level in a hierarchical timing signal distribution scheme without deviating from claimed subject matter.

In this context, a "conducting element" comprises a circuit element capable of permitting current to pass between two nodes. In a particular implementation, a conducting element may vary a current permitted to pass between nodes based, at least in part, on a particular condition. The particular implementations described herein employ FETs as conducting elements to permit current to pass between source and drain terminals based, at least in part, on a voltage applied to a gate terminal. It should be understood, however, that other types of devices such as, a bipolar transistor, diode, variable resistor, etc. may be used as a conducting element, and that claimed subject matter is not limited this respect. In this context, a conducting element having first and second terminals may "connect" the first and second terminals by providing a conductive path between the first and second terminals having a very small or negligible impedance for a particular signal. In one particular example implementation, a conductive element may vary an impedance between the first and second terminals based, at least in part, on a signal provided to a third terminal of the conductive element (e.g., a based on a voltage or current applied to the third terminal). In one aspect, a conductive element may "close" to thereby connect first and second terminals in response to a signal provided on the third terminal. Likewise, a conductive element may "open" to thereby disconnect first and second terminals in response to a different signal provide on the third terminal. In one aspect, a conductive element in an open state may isolate a first portion of a circuit from a second portion of the circuit by removing or disrupting a conductive path between the first and second portions of the circuit. In another aspect, a conducting element may vary an impedance between first and second terminals between opened and closed state based on a signal provided to a third terminal.

In the preceding description and in the accompanying drawings, specific terminology and drawing symbols are set forth to provide a thorough understanding of claimed subject matter. In some instances, the terminology and symbols may imply specific details that are not required to practice the claimed subject matter. For example, the interconnection between circuit elements or circuit blocks may be shown or described as multi-conductor or single conductor signal lines. Each of the multi-conductor signal lines may alternatively be single-conductor signal lines, and each of the single-conductor signal lines may alternatively be multi-conductor signal lines. Signals and signaling paths shown or described as being single-ended may also be differential, and vice-versa. Similarly, signals described or depicted as having active-high or active-low logic levels may have opposite logic levels in alternative embodiments. As another example, circuits described or depicted as including metal oxide semiconductor (MOS) transistors may alternatively be implemented using bipolar technology or any other technology in which a signal-controlled current flow may be achieved. Also signals referred to herein as clock signals may alternatively be strobe signals or other signals that provide event timing. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur if the signal driving circuit is transitioned to a high impedance condition, such as an open drain or open collector condition).

It should be noted that the various circuits disclosed herein may be described using computer aided design tools and expressed (or represented), as data and/or instructions embodied in various machine-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and HLDL, formats supporting register level description languages like RTL, and formats supporting geometry description languages such as GDSII, GDSIII, GDSIV, CIF, MEBES and any other suitable formats and languages. Storage media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.).

If received within a computer system via one or more machine-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the preceding description, in a particular context of usage, such as a situation in which tangible components (and/or similarly, tangible materials) are being discussed, a distinction exists between being "on" and being "over." As an example, deposition of a substance "on" a substrate refers to a deposition involving direct physical and tangible contact without an intermediary, such as an intermediary substance (e.g., an intermediary substance formed during an intervening process operation), between the substance deposited and the substrate in this latter example; nonetheless, deposition "over" a substrate, while understood to potentially include deposition "on" a substrate (since being "on" may also accurately be described as being "over"), is understood to include a situation in which one or more intermediaries, such as one or more intermediary substances, are present between the substance deposited and the substrate so that the substance deposited is not necessarily in direct physical and tangible contact with the substrate.

A similar distinction is made in an appropriate particular context of usage, such as in which tangible materials and/or tangible components are discussed, between being "beneath" and being "under." While "beneath," in such a particular context of usage, is intended to necessarily imply physical and tangible contact (similar to "on," as just described), "under" potentially includes a situation in which there is direct physical and tangible contact, but does not necessarily imply direct physical and tangible contact, such as if one or more intermediaries, such as one or more intermediary substances, are present. Thus, "on" is understood to mean "immediately over" and "beneath" is understood to mean "immediately under."

It is likewise appreciated that terms such as "over" and "under" are understood in a similar manner as the terms "up," "down," "top," "bottom," and so on, previously mentioned. These terms may be used to facilitate discussion, but are not intended to necessarily restrict scope of claimed subject matter. For example, the term "over," as an example, is not meant to suggest that claim scope is limited to only situations in which an embodiment is right side up, such as in comparison with the embodiment being upside down, for example. An example includes a flip chip, as one illustration, in which, for example, orientation at various times (e.g., during fabrication) may not necessarily correspond to orientation of a final product. Thus, if an object, as an example, is within applicable claim scope in a particular orientation, such as upside down, as one example, likewise, it is intended that the latter also be interpreted to be included within applicable claim scope in another orientation, such as right side up, again, as an example, and vice-versa, even if applicable literal claim language has the potential to be interpreted otherwise. Of course, again, as always has been the case in the specification of a patent application, particular context of description and/or usage provides helpful guidance regarding reasonable inferences to be drawn.

Unless otherwise indicated, in the context of the present disclosure, the term "or" if used to associate a list, such as A, B, or C, is intended to mean A, B, and C, here used in the inclusive sense, as well as A, B, or C, here used in the exclusive sense. With this understanding, "and" is used in the inclusive sense and intended to mean A, B, and C; whereas "and/or" can be used in an abundance of caution to make clear that all of the foregoing meanings are intended, although such usage is not required. In addition, the term "one or more" and/or similar terms is used to describe any feature, structure, characteristic, and/or the like in the singular, "and/or" is also used to describe a plurality and/or some other combination of features, structures, characteristics, and/or the like. Furthermore, the terms "first," "second," "third," and the like are used to distinguish different aspects, such as different components, as one example, rather than supplying a numerical limit or suggesting a particular order, unless expressly indicated otherwise. Likewise, the term "based on" and/or similar terms are understood as not necessarily intending to convey an exhaustive list of factors, but to allow for existence of additional factors not necessarily expressly described.

Furthermore, it is intended, for a situation that relates to implementation of claimed subject matter and is subject to testing, measurement, and/or specification regarding degree, to be understood in the following manner. As an example, in a given situation, assume a value of a physical property is to be measured. If alternatively reasonable approaches to testing, measurement, and/or specification regarding degree, at least with respect to the property, continuing with the example, is reasonably likely to occur to one of ordinary skill, at least for implementation purposes, claimed subject matter is intended to cover those alternatively reasonable approaches unless otherwise expressly indicated. As an example, if a plot of measurements over a region is produced and implementation of claimed subject matter refers to employing a measurement of slope over the region, but a variety of reasonable and alternative techniques to estimate the slope over that region exist, claimed subject matter is intended to cover those reasonable alternative techniques, even if those reasonable alternative techniques do not provide identical values, identical measurements or identical results, unless otherwise expressly indicated.

In one particular embodiment, a method comprises: distributing timing signals to a plurality of operational circuit nodes formed on one or more circuit dice though a hierarchical timing signal distribution network; receiving the timing signals at timing signal terminals of two or more of the operational circuit nodes; and coupling timing signals received at timing signal terminals of at least two of the two or more of the operational circuit nodes independently of the hierarchical timing signal distribution network. In one particular implementation, the two or more of the operational circuit nodes are formed on a single circuit die. In another particular implementation, the terminals of the at least two of the two or more operational circuit nodes receive timing signals at terminal nodes of the hierarchical timing signal distribution network, the terminal nodes descending from a common branch node in the hierarchical timing signal distribution network. In yet another particular implementation, coupling the timing signals received at the timing signal terminals of the at least two of the two or more operational circuit nodes comprises applying a conductor between the timing signal terminals of the at least two of the two or more operational circuit nodes. In yet another particular implementation, at least a first operational circuit node of the at least two of the two or more of the operational circuit nodes is formed on a first circuit die and at least a second operational circuit node of the at least two of the two or more of the operational circuit nodes is formed on a second circuit die, the first and second circuit dies being integrated in a multi-die circuit device. In yet another particular implementation, a first timing signal is received by a timing signal terminal of a first operational circuit node of the at least two of the two or more operational circuit nodes at a first terminal node of the hierarchical timing signal distribution network, wherein a second timing signal is received by a timing signal terminal of a second operational circuit node of the at least two of the two or more operational circuit nodes at a second terminal node of the hierarchical timing signal distribution network, and wherein coupling the timing signals received at the timing signal terminals of the at least two of the two or more operational circuit nodes comprises combining the first and second timing signals at one or more AND circuits to provide a combined timing signal.

References throughout this specification to one implementation, an implementation, one embodiment, an embodiment and/or the like means that a particular feature, structure, and/or characteristic described in connection with a particular implementation and/or embodiment is included in at least one implementation and/or embodiment of claimed subject matter. Thus, appearances of such phrases, for example, in various places throughout this specification are not necessarily intended to refer to the same implementation or to any one particular implementation described. Furthermore, it is to be understood that particular features, structures, and/or characteristics described are capable of being combined in various ways in one or more implementations and, therefore, are within intended claim scope, for example. In general, of course, these and other issues vary with context. Therefore, particular context of description and/or usage provides helpful guidance regarding inferences to be drawn.

While there has been illustrated and described what are presently considered to be example features, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular examples disclosed, but that such claimed subject matter may also include all aspects falling within the scope of the appended claims, and equivalents thereof.

What is claimed is:

1. A circuit die for integration with one or more other circuit dies in a multi-die circuit device, the circuit die comprising:
    a first timing signal distribution network, the first timing signal distribution network to transmit a timing signal to a plurality of operational circuit nodes formed on the circuit die;
    a clock circuit to generate a first clock signal for transmission as the timing signal to the plurality of operational circuit nodes, wherein the first timing signal distribution network to comprise a hierarchical timing signal distribution network extending one or more level branches between a root node and the plurality of operational circuit nodes at terminal nodes of the hierarchical timing signal distribution network;
    one or more first conductors to couple with one or more second conductors of at least one of the one or more other circuit dies, the one or more first conductors to connect nodes of a particular branch level in the hierarchical timing signal distribution network with nodes in a second timing signal distribution network, the second timing signal distribution network formed on the at least one of the one or more circuit dies to transmit signals to operational circuit nodes formed on the at least one of the one or more other circuit dies, nodes in the second timing signal distribution network to correspond with the particular branch level;
    a circuit to couple a first timing signal received at a timing signal terminal of a first one of the operational circuit nodes at a first terminal node of the first timing signal distribution network and a second timing signal received at a timing signal terminal of an operational circuit node of a terminal node of the second timing signal distribution network, the circuit to couple the first distributed timing signal and the second distributed timing signal to comprise a plurality of first AND circuits to combine the first and second distributed timing signals, output terminals of at least two of the first AND circuits to be connected to one another and to output terminals of at least two second AND circuits formed on the at least one of the one or more other circuit dies to provide a deskewed timing signal; and
    one or more memory circuits to receive the deskewed timing signal to control execution of at least some of the operational circuit nodes.

2. The circuit die of claim 1, wherein the one or more memory circuits comprise one or more flip-flop circuits.

3. The circuit die of claim 1, wherein the clock circuit comprises a phase-locked loop circuit.

4. The circuit die of claim 1, wherein the at least one of the one or more other circuit dies comprises:
a switch circuit to apply a second clock signal, the second clock signal to be generated externally to the circuit die, for transmission as the timing signal in lieu of the first clock signal; and
one or more contact pins to receive an external signal, and wherein the switch circuit is further adapted to selectively apply the second clock sign for transmission as the timing signal in lieu of the first clock signal responsive a signal applied to at least one of the one or more contact pins.

5. A method comprising:
generating a first clock signal from a first clock circuit formed on a first circuit die;
applying the first clock signal as a timing signal for distribution to a plurality of operational circuit nodes formed on the first circuit die;
distributing the timing signal to the plurality of operational circuit nodes formed on the first circuit die through a first timing signal distribution network formed on the first circuit die, nodes of a particular branch level in the first timing signal distribution network being connected to nodes in a second timing signal distribution network formed on at least one of one or more other circuit dies, the nodes in the second timing signal distribution network of the one or more other circuit dies corresponding with the particular branch level;
combining a first distributed timing signal received at a timing signal terminal of an operational circuit node at a terminal node of the first timing signal distribution network and a second distributed timing signal received at a timing signal terminal of an operational circuit at a terminal node of the second timing signal distribution network at a first AND circuit formed on the first circuit die, an output terminal of the first AND circuit to be connected to an output terminal of a second AND circuit formed on the at least one of the one or more other circuit to provide a deskewed timing signal; and
controlling execution of at least one of the operational circuit nodes responsive to receipt of the deskewed timing signal at one or more memory circuits formed on the first circuit die.

6. The method of claim 5, wherein the one or more memory circuits comprise one or more flip-flop circuits.

7. The method of claim 5, wherein the first clock circuit comprises a phase-locked loop circuit.

8. The method of claim 5, wherein the at least one of the one or more other circuit dies further comprises:
a second clock circuit to generate a second clock signal for distribution to one or more operational circuit nodes formed on the at least one of the one or more other circuit dies; and
circuitry to selectively apply the second clock signal for transmission as the timing signal in lieu of the first clock signal responsive to a signal applied to at least one of one or more contact pins disposed on the at least one of the one or more other circuit dies.

9. A first circuit die comprising:
a plurality of first operational circuit nodes;
a first timing signal distribution network to transmit timing signals to timing signal terminals of one or more of the plurality of the first operational circuit nodes;
one or more first conductors to connect to one or more second conductors formed on a second circuit die;
a circuit to couple a first distributed timing signal received at a timing signal terminal of one of the one or more first operational circuit nodes at a terminal node of the first timing signal distribution network and a second distributed timing signal received at a timing signal terminal of an operational circuit node formed on the second circuit die at a terminal node of a second timing signal distribution network formed on the second circuit die to provide a deskewed timing signal, the circuit to couple the first distributed timing signal and the second distributed timing signal to comprise a plurality of first AND circuits to combine the first and second distributed timing signals, output terminals of at least two of the first AND circuits to be connected to one another and to output terminals of at least two second AND circuits formed on the second circuit die to provide the deskewed timing signal; and
one or more flip-flop circuits to receive the deskewed timing signal to control execution of at least some of the operational circuit nodes.

10. The first circuit die of claim 9, wherein timing signal terminals of the at least one of the plurality of the first operational circuit nodes are to receive timing signals at terminal nodes of the first timing signal distribution network, the terminal nodes descending from a common branch node in the first timing signal distribution network.

11. The first circuit die of claim 9, wherein the first circuit die further to comprise a conductor connecting timing signal terminals of at least two of the first operational circuit nodes.

12. The first circuit die of claim 9, wherein the first circuit die to be adapted to be integrated with the second circuit die in a multi-die circuit device.

13. The first circuit die of claim 9, and further comprising a circuit to selectively inhibit receipt of the transmitted timing signals on at least one of the first operational circuit nodes, comprising a first input terminal to receive the transmitted timing signals, a second input terminal to receive a control signal and an output terminal to selectively apply at least one of the transmitted timing signals to a timing signal terminal of the at least one of the first operational circuit nodes or a branch in the first timing signal distribution network based, at least in part, on the control signal received at the second input terminal.

14. The circuit die of claim 1, wherein the one or more first conductors are coupled to input terminals of first memory circuits formed on the circuit die through a particular number of buffer circuits, and wherein the one or more second conductors are coupled to input terminals of second memory circuits formed on at least one circuit die of the one or more other circuit dies through the particular number of buffer circuits.

15. The method of claim 5, wherein the nodes of the particular branch level are coupled to input terminals of first memory circuits formed on the first circuit die through a particular number of buffer circuits, and wherein the nodes in the second timing signal distribution network are coupled to input terminals of second input terminals of second memory circuits formed on the at least one of the one or more of the other circuit dies through the particular number of buffer circuits formed on the at least one of the one or more other circuit dies.

* * * * *